(12) United States Patent
DiBene, II et al.

(10) Patent No.: US 10,224,873 B1
(45) Date of Patent: Mar. 5, 2019

(54) VOLTAGE COLLECTION BOOTSTRAP CIRCUIT

(71) Applicant: Apple Inc., Cupertino, CA (US)

(72) Inventors: Joseph T. DiBene, II, Santa Cruz, CA (US); Rashed Mahameed, Umm Al-Fahem (IL); Brad W. Simeral, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 255 days.

(21) Appl. No.: 15/377,004

(22) Filed: Dec. 13, 2016

Related U.S. Application Data

(60) Provisional application No. 62/398,160, filed on Sep. 22, 2016.

(51) Int. Cl.
*H02K 33/18* (2006.01)
*H02N 2/18* (2006.01)
*H03B 5/12* (2006.01)

(52) U.S. Cl.
CPC ........... *H03B 5/1234* (2013.01); *H02K 33/18* (2013.01); *H02N 2/186* (2013.01); *H03B 5/1203* (2013.01); *H03B 5/1228* (2013.01)

(58) Field of Classification Search
CPC ........ H02K 33/00; H02K 33/02; H02K 33/18; H02N 2/18; H02N 2/181; H02N 2/186; H02N 2/188
See application file for complete search history.

(56) References Cited

U.S. PATENT DOCUMENTS

| 7,485,992 | B2 | 2/2009 | Ekchian et al. | |
| 7,608,933 | B2 | 10/2009 | Yang | |
| 9,124,113 | B2 | 9/2015 | Hu et al. | |
| 2009/0289056 | A1* | 11/2009 | Suenaga | H05B 6/685 219/702 |
| 2013/0033131 | A1 | 2/2013 | Kahng et al. | |
| 2013/0264829 | A1* | 10/2013 | Jordan, Sr. | F03D 9/007 290/55 |
| 2014/0184154 | A1 | 7/2014 | Okazaki | |
| 2014/0346889 | A1* | 11/2014 | Abe | H02J 5/005 307/104 |
| 2015/0180240 | A1 | 6/2015 | Kwon et al. | |

FOREIGN PATENT DOCUMENTS

| EP | 2688188 | 1/2014 |
| WO | 2013/190585 | 12/2013 |

* cited by examiner

*Primary Examiner* — Levi Gannon
(74) *Attorney, Agent, or Firm* — Meyertons, Hood, Kivlin, Kowert & Goetzel, P.C.

(57) ABSTRACT

In various embodiments, a voltage collection bootstrap circuit includes a capacitor, an inductor, an oscillator, a bias circuit, and a switch. A current may be induced in the inductor, the oscillator, or both. The inductor, the oscillator, or both may store energy in the capacitor. The inductor, capacitor, and oscillator may supply energy to the bias circuit. The bias circuit may output a difference between a reference voltage and a voltage corresponding to the energy received from at least one of the inductor, capacitor, and oscillator. Based on the output of the bias circuit, a switch may connect the voltage collection circuit to an output of at least one of the inductor, capacitor, and oscillator. Accordingly, energy may be provided to the voltage collection circuit using one or more induced currents.

20 Claims, 6 Drawing Sheets

VOLTAGE COLLECTION BOOTSTRAP CIRCUIT

This application claims the benefit of U.S. Provisional Application No. 62/398,160, filed on Sep. 22, 2016, which is incorporated by reference herein in its entirety.

BACKGROUND

Technical Field

This disclosure relates generally to a voltage collection bootstrap circuit.

Description of the Related Art

In recent years, power management has become an increasingly important factor in the design of electronic devices, especially portable electronic devices. Often electronic devices use a battery to provide power when the electronic devices are away from another power source. However, batteries store a limited amount of energy. One way to preserve a battery life of such devices is to recharge the battery when the device is away from a charger. However, components of mechanisms that recharge a battery may themselves consume power, which may offset power provided by recharging the battery.

SUMMARY

In various embodiments, a voltage collection bootstrap circuit is disclosed that includes a capacitor, an inductor, an oscillator, a bias circuit, and a switch. A current may be induced in the inductor, the oscillator, or both. The inductor, the oscillator, or both may store energy in the capacitor. The inductor, capacitor, and oscillator may supply energy to the bias circuit. The bias circuit may output a difference between a reference voltage and a voltage corresponding to the energy received from at least one of the inductor, capacitor, and oscillator. Based on the output of the bias circuit, a switch may connect the voltage collection circuit to an output of at least one of the inductor, capacitor, and oscillator. Accordingly, energy may be provided to the voltage collection circuit using one or more induced currents. As a result, at least some devices of the voltage collection circuit may be powered using current induced at the inductor, the oscillator, or both. Thus, an amount of battery energy used to power the voltage collection circuit may be reduced, as compared to a voltage collection circuit that uses battery power to provide energy to devices of the voltage collection circuit.

Figure 1:
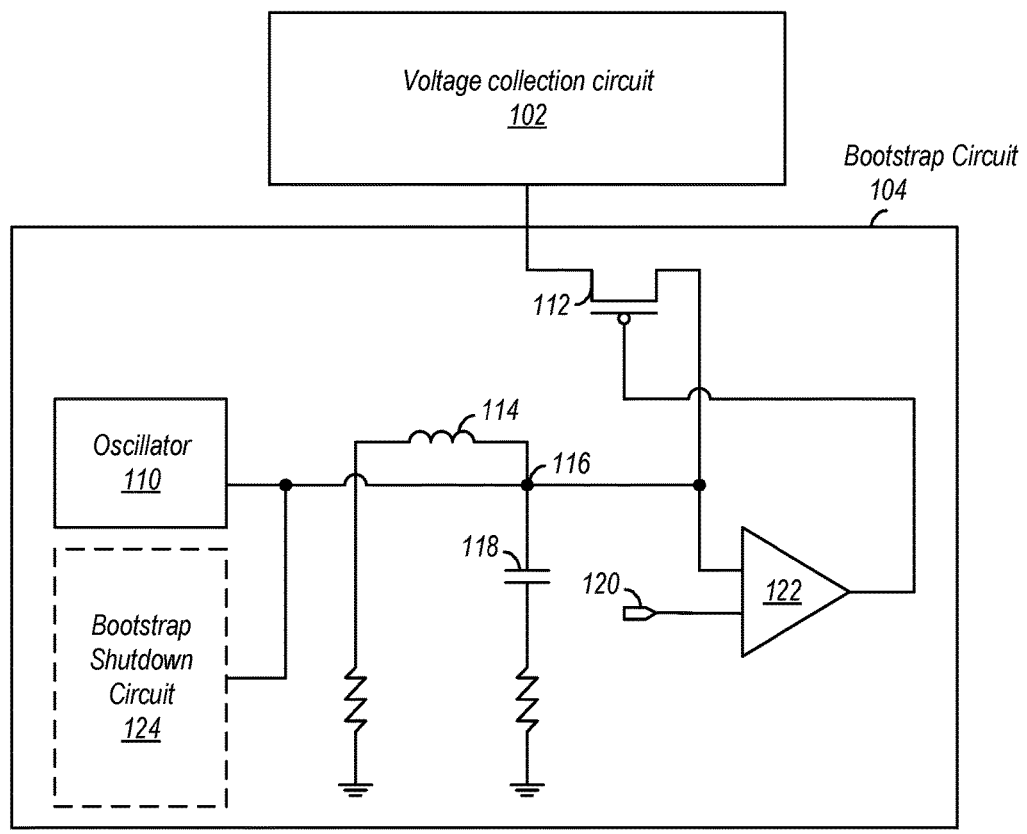
FIG. 1 is a block diagram illustrating an embodiment of an energy collection system that includes a voltage collection bootstrap circuit.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation [entity] configured to [perform one or more tasks] is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "capacitor configured to store energy" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. s phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a device that includes six transistors, the terms "first transistor" and "second transistor" can be used to refer to any two of the six transistors, and not, for example, just logical transistors 0 and 1.

When used in the claims, the term "or" is used as an inclusive or and not as an exclusive or. For example, the phrase "at least one of x, y, or z" means any one of x, y, and z, as well as any combination thereof (e.g., x and y, but not z).

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION

A magnetic charging device integrated in a mobile device may include a magnet connected to a bearing such that the magnet rotates around the bearing in response to movement of the magnetic charging device. The movement of the magnet around the bearing may induce a current in one or more inductors of a voltage collection circuit and one or more inductors of a voltage collection bootstrap circuit. As discussed below, the current may be used by the voltage collection bootstrap circuit to provide energy to various devices of the voltage collection circuit. The current may be used by the voltage collection circuit to recharge a battery. Accordingly, movement of the mobile device may cause a battery of the mobile device to be recharged over time, extending a battery life of the mobile device.

At least one of the inductors may be part of a voltage collection bootstrap circuit that charges up to a particular amount of energy. In particular, the voltage collection bootstrap circuit may use at least some current induced at a bootstrap inductor to store energy at a bootstrap capacitor. Additionally, at least some of the current may be used to trigger an oscillator, which may include at least one inductor and at least one capacitor. The oscillator may intermittently supply energy. At least one of the bootstrap inductor, the bootstrap capacitor, or the oscillator may provide energy to a bias circuit, which may output a difference between a threshold voltage and a voltage of the energy received from the at least one of the bootstrap inductor, the bootstrap capacitor, or the oscillator. The output of the bias circuit may be used to trigger a switch. In response to being triggered, the switch may provide the energy from at least one of the bootstrap inductor, the bootstrap capacitor, or the oscillator to the voltage collection circuit. As a result, the voltage collection circuit may consume less battery power, as compared to a system where a voltage collection bootstrap circuit is not present.

As used herein, a circuit "intermittently" supplying energy is intended to be interpreted broadly. An "intermittent" supply of energy may be supplied with a regular period or an irregular period. A symmetrical supply of energy or a periodic supply of energy is intended to be included. For example, a system that repeatedly supplies 5V for one second and then 0V for nine seconds would be considered herein to be a system that "intermittently" supplies energy.

This disclosure initially describes, with reference to FIG. 1, various portions of various embodiments of an energy collection system that includes a voltage collection circuit and a bootstrap circuit. An example energy harvester device that induces a plurality of currents in an embodiment of an energy collection system is described with reference to FIG. 2. An embodiment of an energy collection system that includes a voltage collection circuit and a bootstrap circuit is described with reference to FIG. 3. A method of providing energy to a voltage collection circuit is described with reference to FIG. 4. The techniques and structures described herein, however, are in no way limited to the one or more energy collection systems or bootstrap circuits described with reference to FIGS. 1-4; rather, this context is provided only as one or more possible implementations. An exemplary computing system that includes a bootstrap circuit is described with reference to FIG. 5. Finally, a process of fabricating a bootstrap circuit is described with reference to FIG. 6.

Turning now to FIG. 1, a block diagram of an embodiment of an energy collection system is shown. In the illustrated embodiment, the energy collection system includes voltage collection circuit 102 and bootstrap circuit 104. Bootstrap circuit 104 includes oscillator 110, switch 112, inductor 114, node 116, capacitor 118, reference voltage 120, and bias circuit 122. In some embodiments, bootstrap circuit 104 further includes bootstrap shutdown circuit 124. In some embodiments, one or more additional circuits may be present. For example, as discussed further with reference to FIG. 3, in some embodiments, bootstrap circuit 104 may include a buffer that causes bootstrap circuit 104 to intermittently output energy as a digital pulse. In various embodiments, one or more functionally equivalent circuits may instead be used. For example, switch 112 may be replaced by one or more transmission gates, one or more bipolar transistors, or other electronic switching devices.

Voltage collection circuit 102 may recharge a battery of a device (e.g., a mobile device). Bootstrap circuit 104 may provide energy to power various portions of voltage collection circuit 102. In some embodiments (e.g., when bootstrap shutdown circuit 124 is present), voltage collection circuit 102 may also provide energy to power the various portions of voltage collection circuit 102. However, bootstrap circuit 104 may provide energy more quickly, may provide energy in response to a smaller induced current, or both, as compared to voltage collection circuit 102. In the illustrated embodiment, because energy is provided to voltage collection circuit 102 by bootstrap circuit 104 using inductor 114, voltage collection circuit 102 and bootstrap circuit 104 may be designed to consume less energy, as compared to a system where portions of voltage collection circuit 102 are powered by a battery.

In various embodiments, bootstrap circuit 104 may provide energy in response to a current being induced at inductor 114. In particular, the current may cause energy to be stored at capacitor 118 via node 116. Capacitor 118 may intermittently provide energy to node 116. Additionally, in some cases, the current may cause oscillator 110 to intermittently supply energy. One or more inductors of oscillator 110 may be mutually coupled with inductor 114 and may be used to intermittently supply energy to node 116. Accordingly, when the current is induced in inductor 114, oscillator 110 may also generate energy. In various embodiments, the one or more inductors of oscillator 110 may be smaller than inductor 114, which may reduce an area associated with bootstrap circuit 104.

Bias circuit 122 may output a difference between the voltage at node 116 and reference voltage 120. In various embodiments, as discussed below with reference to FIG. 3, bias circuit 122 may be powered by the voltage at node 116. Reference voltage 120 may be generated using at least one of the current induced at inductor 114 in conjunction with a load, energy stored at capacitor 118, energy generated by oscillator 110, or another energy source (e.g., a battery or one or more devices of voltage collection circuit 102).

Switch 112 may, based on the output of bias circuit 122, connect node 116 to voltage collection circuit 102. Accordingly, switch 112 may provide energy from node 116 (e.g., from at least one of inductor 114, oscillator 110, or capacitor 118) to voltage collection circuit 102. In the illustrated embodiment, switch 112 is a metal-oxide-semiconductor field effect transistor (MOSFET). Accordingly, bootstrap circuit 104 may provide energy to voltage collection circuit 102. In some cases, as further discussed below with reference to FIG. 3, the energy may be used to power one or more devices of voltage collection circuit 102.

Bootstrap shutdown circuit 124 may reduce an amount of energy provided by bootstrap circuit 104 to voltage collection circuit 102 by reducing a voltage at node 116. In some embodiments, bootstrap shutdown circuit 124 may reduce the voltage at node 116 by reducing a current at inductor 114. For example, in response to a voltage at node 116 reaching a threshold level, bootstrap shutdown circuit 124 may reduce the amount of energy provided by bootstrap circuit 104. As another example, once a threshold amount of energy has been provided to voltage collection circuit 102, bootstrap shutdown circuit 124 may reduce the voltage provided by bootstrap circuit 104.

Figure 2:
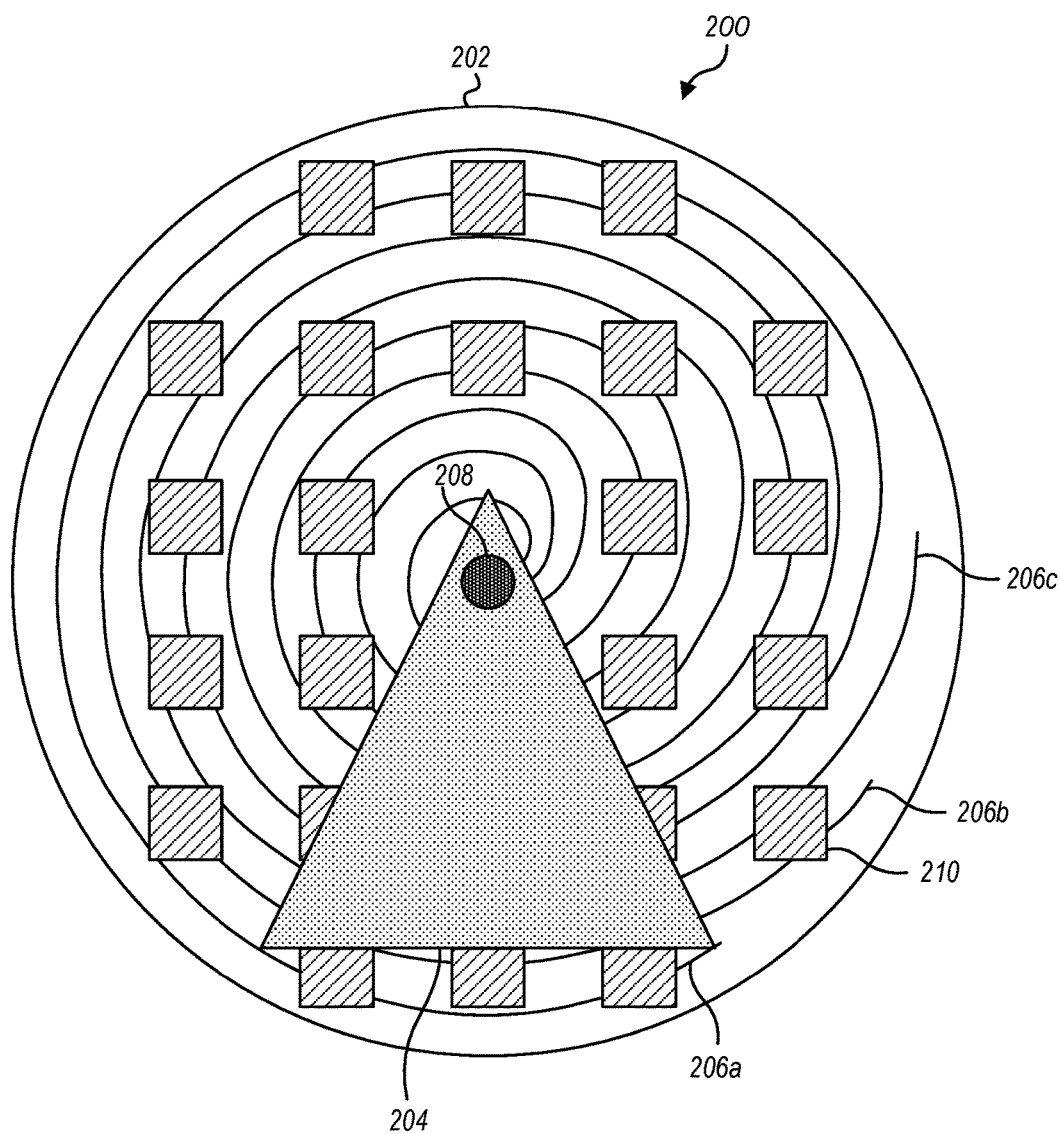
FIG. 2 is a block diagram illustrating an embodiment of an energy harvester device that induces at least one current in an energy collection system.

Turning now to FIG. 2, a block diagram illustrating an embodiment of an energy harvester device 200 that induces one or more currents in an energy collection system. In the illustrated embodiment, energy harvester device 200 includes substrate 202, wedge magnet 204, coils 206a-c, bearing 208, and bias magnets 210. In various embodiments, portions of FIG. 2 may correspond to or be combined with various portions of FIG. 1. For example, coil 206b may correspond to inductor 114. Further, coil 206a may correspond to an inductor of oscillator 110 and coil 206c may correspond to an inductor of voltage collection circuit 102. As another example, one or more devices of bootstrap circuit 104 (e.g., switch 112), voltage collection circuit 102, or both, may be formed in substrate 202.

In the illustrated embodiment, bearing 208 and coils 206a-c are formed in substrate 202. Bearing 208 may extend in an axis perpendicular to substrate 202. Wedge magnet 204 may be connected to bearing 208. In some embodiments, wedge magnet 204 may and may extend in a plane that is parallel to substrate 202. In some embodiments, bearing 208 may be a physical structure and wedge magnet 204 may be affixed to bearing 208. In other embodiments, bearing 208 may have other structures. For example, bearing 208 may be an air bearing. Energy harvester device 200 may be placed in a housing that can be moved by a user (e.g., a housing that is placed on a user's wrist). When the housing is moved (e.g., by the user moving their wrist), wedge magnet 204 may spin around bearing 208. Wedge magnet 204 may be a permanent magnet or an electromagnet. In some embodiments, one or more other devices may be used to spin wedge magnet 204. For example, a user may push a button or turn a knob to cause wedge magnet 204 to spin. The spinning of wedge magnet 204 may induce currents in coils 206a-n. As discussed above, the currents may be used to supply energy to a battery, recharging the battery.

Bias magnets 210 may be used to prevent wedge magnet 204 from spinning until a particular amount of force is applied to a housing of energy harvester device 200. Further, in some cases, bias magnets 210 may apply electromagnetic force on wedge magnet 204, which, in some cases, may accelerate or decelerate wedge magnet 204 in a direction (e.g., clockwise or counterclockwise) that wedge magnet 204 is spinning. In other words, in the illustrated embodiment, electrically-based dampening is used on wedge magnet 204. In some cases, bias magnets 210 may cause wedge magnet 204 to oscillate within a particular range of motion. In the illustrated embodiment, bias magnets 210 may be formed from permanent magnets (e.g., rare earth magnets). However, in other embodiments, one or more of bias magnets 210 may be formed from electromagnets.

In some embodiments, more or fewer instances of various devices (e.g., coils 206a-c or bias magnets 210) may be used. Additionally, in some embodiments, various devices (e.g., bias magnets 210) may not be present or may be present (e.g., magnetic shielding for energy harvester device 200). Further, in some embodiments, various devices may be combined in a different manner or may appear differently. For example, at least one of bearing 208, one or more of bias magnets 210, or one or more of coils 206a-c may be affixed to substrate 202. As another example, other shapes may be used for wedge magnet 204 (e.g., a rectangle). As another example, one or more of coils 206a-c may have turns and may consume less area of substrate 202.

Figure 3:
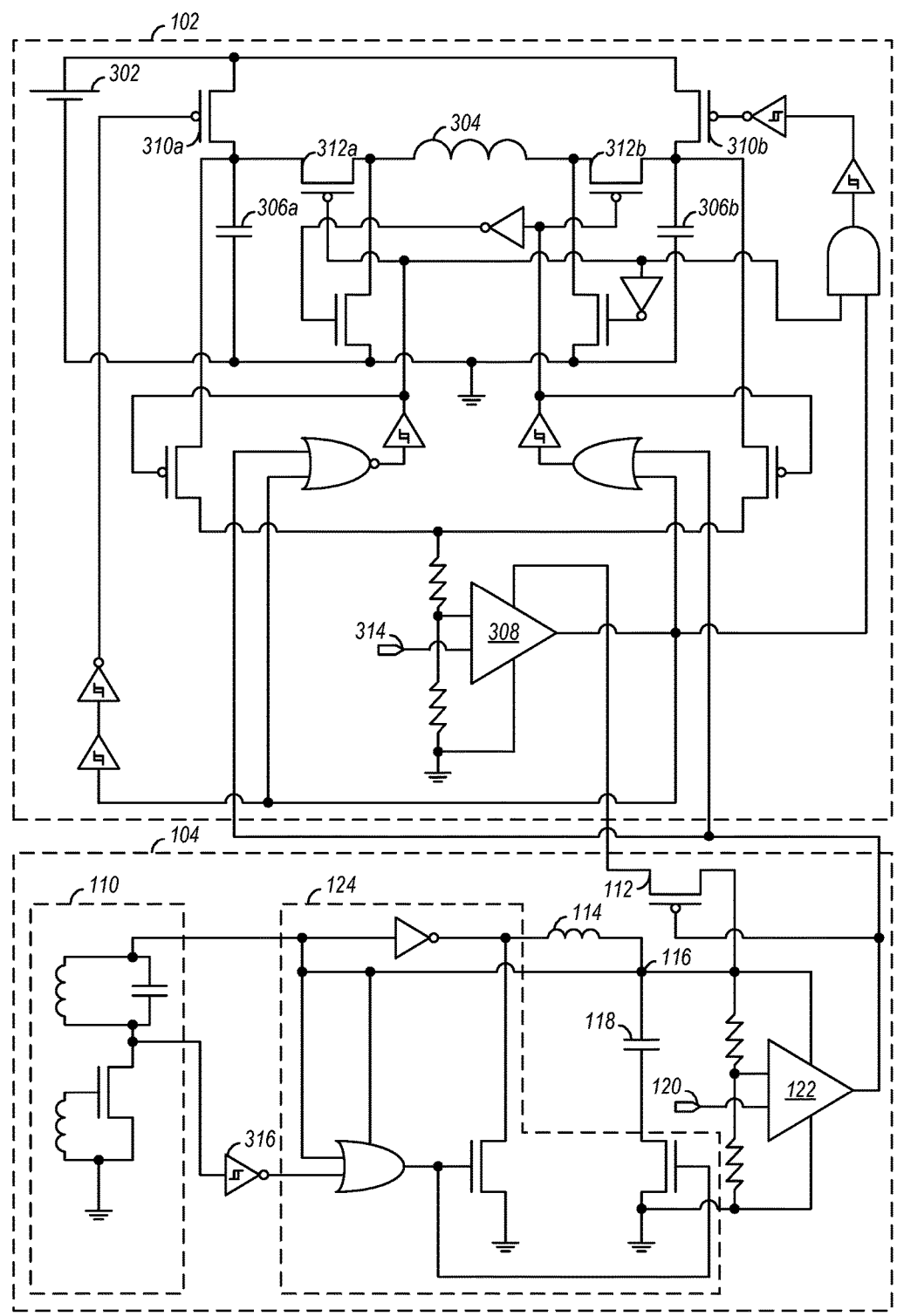
FIG. 3 is a block diagram illustrating configuration of an embodiment of an energy collection system.

Turning now to FIG. 3, a block diagram illustrating an embodiment of an energy collection system that includes an embodiment of voltage collection circuit 102 and an embodiment of bootstrap circuit 104 of FIG. 1 is shown. As described above, bootstrap circuit 104 includes oscillator 110, switch 112, inductor 114, node 116, capacitor 118, reference voltage 120, and bias circuit 122. Additionally, in the illustrated embodiment, bootstrap circuit 104 includes buffer 316. In the illustrated embodiment, voltage collection circuit 102 includes battery 302, main inductor 304, main capacitors 306a-b, main bias circuit 308, switches 310a-b, switches 312a-b, and main reference voltage 314. Although the illustrated embodiment includes particular numbers of various devices (e.g., main capacitors 306a-b), in other embodiments, more or fewer devices may be used.

As discussed above with reference to FIG. 1, bootstrap circuit 104 provides energy to voltage collection circuit 102. In the illustrated embodiment, buffer 316 converts at least a portion of energy supplied by oscillator 110 into a digital pulse. The digital pulse may be used to intermittently reduce a voltage at node 116. Accordingly, in some embodiments, energy may be output by bootstrap circuit 104 as a digital pulse to voltage collection circuit 102. In various embodiments, the digital pulse may be synchronized with various portions of voltage collection circuit 102 and may prevent main inductor 304 from being connected to battery 302 (e.g., by alternately triggering switches 310 and 312).

In response to receiving energy from bootstrap circuit 104, voltage collection circuit 102 may store energy in battery 302. Energy from switch 112, or both may be used to provide power to various devices of voltage collection circuit 102. For example, an output of switch 112 may be used to power main bias circuit 308. Additionally, in the illustrated embodiment, an output of bias circuit 122 may cause one or more of switches 312a-b to toggle. As noted above, main inductor 304 may receive an induced current (e.g., from wedge magnet 204). In the illustrated embodiment, main inductor 304 may provide energy to main capacitor 306a via switch 312a. Additionally, main inductor 304 may provide energy to main capacitor 306b via switch 312b. Main bias circuit 308 may output a difference between a voltage at one or more of main capacitors 306a-b and main reference voltage 314. In some embodiments, main reference voltage 314 may be the same voltage as reference voltage 120. Based on the output of main bias circuit 308, one or more of switches 310a-b and one or more of switches 312a-b may toggle, connecting at least one of main capacitors 306a-b to a supply of battery 302. For example, when main capacitor 306a exceeds a voltage of battery 302 by a threshold amount (e.g., one volt), switches 310a and 312a may toggle, connecting main capacitor 306a to battery 302. When connected to battery 302, main capacitors 306a-b may discharge, providing additional energy to battery 302. Accordingly, voltage collection circuit 102 may provide additional energy to battery 302 using energy accumulated from main inductor 304.

In some embodiments, main capacitors 306a-b may receive energy based on a direction of a current received at main inductor 304 (e.g., based on a direction of wedge magnet 204 of FIG. 2). For example, in response to wedge magnet 204 moving clockwise, main capacitor 306a may receive energy from main inductor 304. In response to wedge magnet 204 moving counterclockwise, main capacitor 306b may receive energy from main inductor 304. In some embodiments, other circuit designs may be used. For example, only a single main capacitor may be used.

In the illustrated embodiment, main inductor 304, inductor 114, and the inductors of oscillator 110 are mutually coupled. Accordingly, when a current is induced in one of the inductors, a current is induced in all of the inductors. However, in other embodiments, the inductors may be arranged differently. In the illustrated embodiment, main inductor 304 is larger than inductor 114 and inductor 114 is larger than the inductors of oscillator 110. Similarly, main capacitors 306a-b may be larger than capacitor 118 and capacitor 118 may be larger than the capacitor of oscillator 110. As a result, it may take longer to provide energy to various portions of voltage collection circuit 102 using main inductor 304 and one or more of main capacitors 306a-b as compared to using bootstrap circuit 104.

Figure 4:
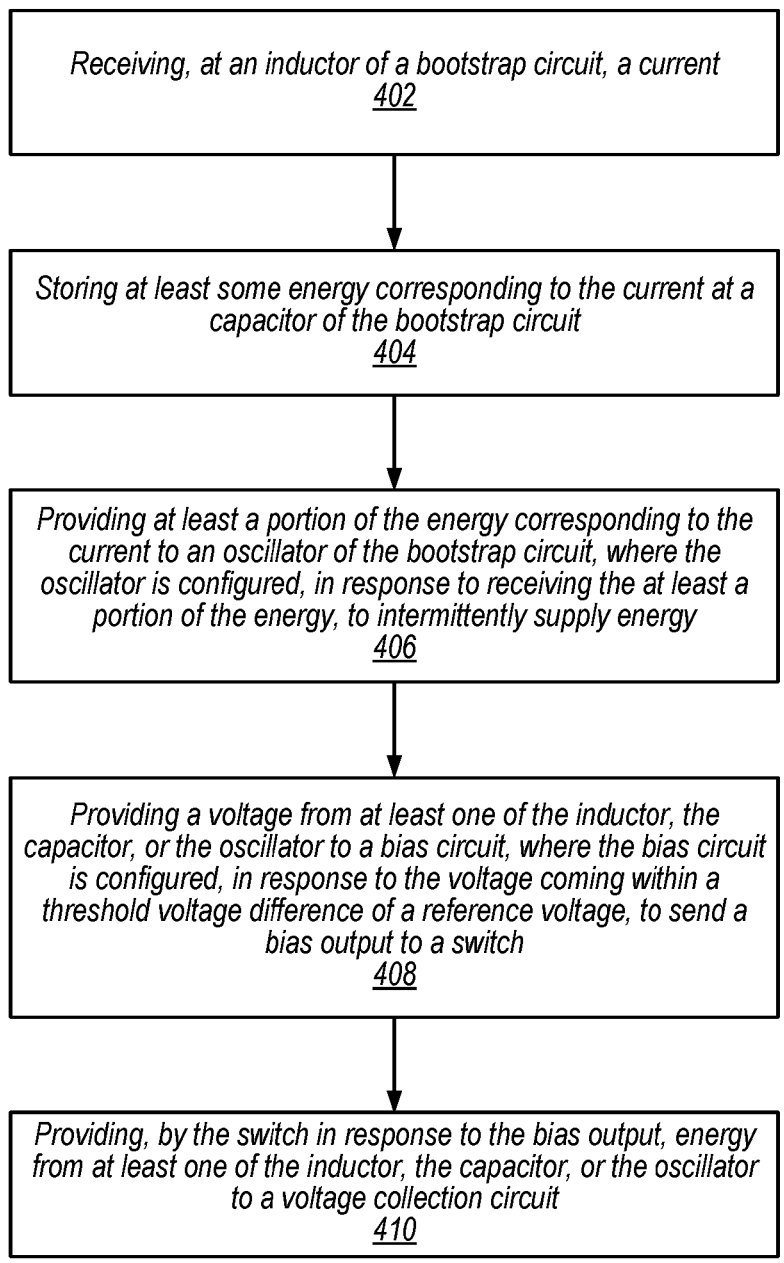
FIG. 4 is a flow diagram illustrating an embodiment of a method of providing energy to a voltage collection circuit.

Referring now to FIG. 4, a flow diagram of a method 400 is depicted. Method 400 is an embodiment of a method of providing energy to a voltage collection circuit. In some embodiments, method 400 may be initiated or performed by one or more processors in response to one or more instructions stored by a computer-readable storage medium.

At 402, method 400 includes receiving, at an inductor of a bootstrap circuit, a current. For example, a current may be induced at inductor 114 of bootstrap circuit 104 of FIG. 1.

At 404, method 400 includes storing at least some energy corresponding to the current at a capacitor of the bootstrap circuit. For example, at least some energy corresponding to the current induced at inductor 114 may be stored at capacitor 118.

At 406, method 400 includes providing at least a portion of the energy corresponding to the current to an oscillator of the bootstrap circuit, where the oscillator is configured, in response to receiving the at least a portion of the energy, to intermittently supply energy. For example, energy may be supplied to oscillator 110. In response to receiving the energy, oscillator 110 may intermittently supply energy to node 116.

At 408, method 400 includes providing a voltage from at least one of the inductor, the capacitor, or the oscillator to a bias circuit, where the bias circuit is configured, in response to the voltage coming within a threshold voltage difference of a reference voltage, to send a bias output to a switch. For example, a voltage at node 116 may be provided to bias circuit 122. Bias circuit 122 may output a bias output signal to switch 112 in response to a difference between the voltage at node 116 and reference voltage 120 being within a threshold voltage difference.

At 410, method 400 includes providing, by the switch in response to the bias output, energy from at least one of the inductor, the capacitor, or the oscillator to a voltage collection circuit. For example, switch 112 may provide the voltage at node 116 to voltage collection circuit 102. Accordingly, a method of providing energy to a voltage collection circuit is depicted.

Figure 5:
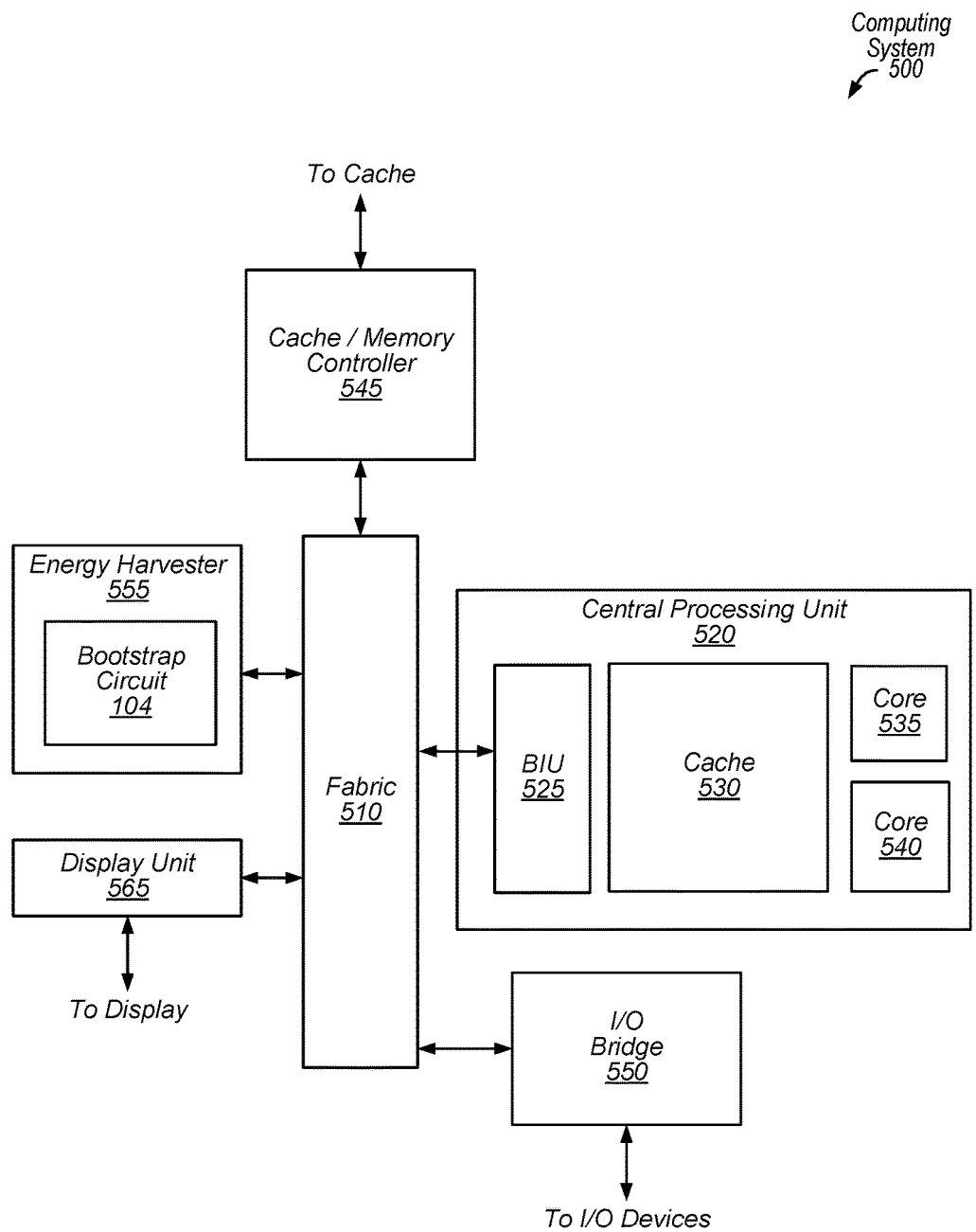
FIG. 5 is block diagram illustrating an embodiment of a computing system that includes a voltage collection bootstrap circuit.

Turning next to FIG. 5, a block diagram illustrating an embodiment of a computing system 500 that includes at least a portion of a voltage collection bootstrap circuit. In some embodiments, some or all elements of the computing system 500 may be included within a system on a chip (SoC) (e.g., within substrate 202 of FIG. 2). In some embodiments, computing system 500 is included in a mobile device such as a smartphone, tablet, laptop computer, or smartwatch. Accordingly, in at least some embodiments, area and power consumption of the computing system 500 may be important design considerations. In the illustrated embodiment, the computing system 500 includes fabric 510, central processing unit (CPU) 520, input/output (I/O) bridge 550, cache/memory controller 545, energy harvester 555, and display unit 565.

The computing system 500 includes an energy harvester 555, which includes bootstrap circuit 104 of FIG. 1. Energy harvester 555 may additionally include one or more of the circuits described above with reference to FIGS. 1-4, including any variations or modifications described previously with reference to FIGS. 1-4. For example, energy harvester 555 may also include voltage collection circuit 102. Although the computing system 500 illustrates energy harvester 555 as being connected to fabric 510, in other embodiments, energy harvester 555 may be connected to or included in other components of the computing system 500. Energy harvester 555 may also be external to and coupled to computing system 500. Additionally or alternatively, the computing system 500 may include multiple energy harvesters 555. The multiple energy harvesters 555 may correspond to different embodiments or to the same embodiment.

Fabric 510 may include various interconnects, buses, MUXes, controllers, etc., and may be configured to facilitate communication between various elements of computing system 500. In some embodiments, portions of fabric 510 are configured to implement various different communication protocols. In other embodiments, fabric 510 implements a single communication protocol and elements coupled to fabric 510 may convert from the single communication protocol to other communication protocols internally.

In the illustrated embodiment, central processing unit 520 includes bus interface unit (BIU) 525, cache 530, and cores 535 and 540. In various embodiments, central processing unit 520 includes various numbers of cores and/or caches. For example, central processing unit 520 may include 1, 2, or 4 processor cores, or any other suitable number. In some embodiments, cores 535 and/or 540 include internal instruction and/or data caches. In some embodiments, a coherency unit (not shown) in fabric 510, cache 530, or elsewhere in computing system 500 is configured to maintain coherency between various caches of computing system 500. BIU 525 may be configured to manage communication between central processing unit 520 and other elements of computing system 500. Processor cores such as cores 535 and 540 may be configured to execute instructions of a particular instruction set architecture (ISA), which may include operating system instructions and user application instructions.

Cache/memory controller 545 may be configured to manage transfer of data between fabric 510 and one or more caches and/or memories (e.g., non-transitory computer readable mediums). For example, cache/memory controller 545 may be coupled to an L3 cache, which may, in turn, be coupled to a system memory. In other embodiments, cache/memory controller 545 is directly coupled to a memory. In some embodiments, the cache/memory controller 545 includes one or more internal caches. In some embodiments, the cache/memory controller 545 may include or be coupled to one or more caches and/or memories that include instructions that, when executed by one or more processors (e.g., central processing unit 520 and/or one or more cores 535, 540), cause the processor, processors, or cores to initiate or perform some or all of the processes described above with reference to FIGS. 1-4 or below with reference to FIG. 6.

As used herein, the term "coupled to" may indicate one or more connections between elements, and a coupling may include intervening elements. For example, in FIG. 5, display unit 565 may be described as "coupled to" central processing unit 520 through fabric 510. In contrast, in the illustrated embodiment of FIG. 5, display unit 565 is "directly coupled" to fabric 510 because there are no intervening elements.

Display unit 565 may be configured to read data from a frame buffer and provide a stream of pixel values for display. Display unit 565 may be configured as a display pipeline in some embodiments. Additionally, display unit 565 may be configured to blend multiple frames to produce an output frame. Further, display unit 565 may include one or more interfaces (e.g., MIPI® or embedded display port (eDP)) for coupling to a user display (e.g., a touchscreen or an external display).

I/O bridge 550 may include various elements configured to implement: universal serial bus (USB) communications, security, audio, and/or low-power always-on functionality, for example. I/O bridge 550 may also include interfaces such as pulse-width modulation (PWM), general-purpose input/output (GPIO), serial peripheral interface (SPI), and/or inter-integrated circuit (I2C), for example. Various types of peripherals and devices may be coupled to computing system 500 via I/O bridge 550. In some embodiments, central processing unit 520 may be coupled to computing system 500 via I/O bridge 550.

Figure 6:
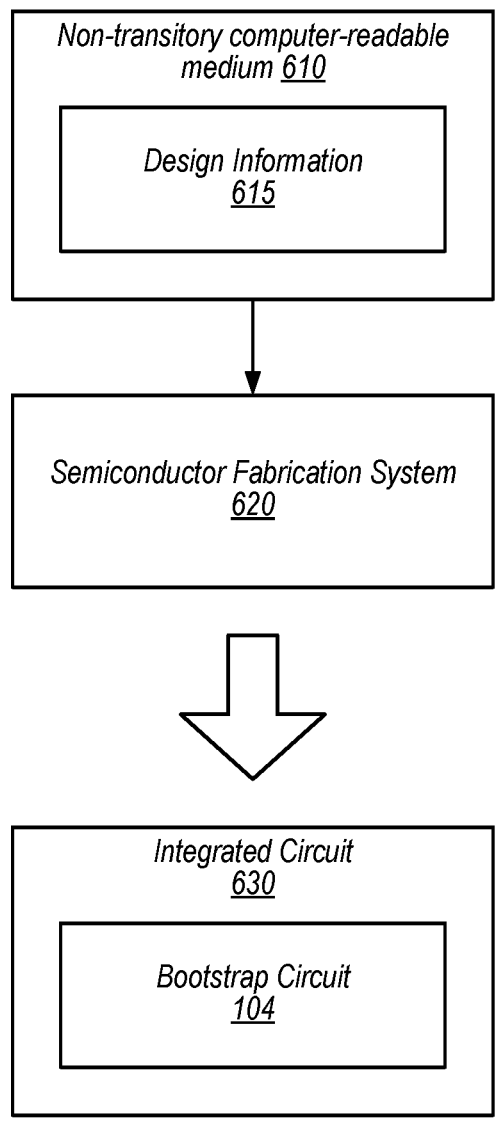
FIG. 6 is a block diagram illustrating one embodiment of a process of fabricating a voltage collection bootstrap circuit.

FIG. 6 is a block diagram illustrating a process of fabricating a voltage collection bootstrap circuit. FIG. 6 includes a non-transitory computer-readable medium 610 and a semiconductor fabrication system 620. Non-transitory computer-readable medium 610 includes design information 615. FIG. 6 also illustrates a resulting fabricated integrated circuit 630. Integrated circuit 630 includes bootstrap circuit 104 of FIG. 1. In the illustrated embodiment, semiconductor fabrication system 620 is configured to process design information 615 stored on non-transitory computer-readable medium 610 and fabricate integrated circuit 630.

Non-transitory computer-readable medium 610 may include any of various appropriate types of memory devices or storage devices. For example, non-transitory computer-readable medium 610 may include at least one of an installation medium (e.g., a CD-ROM, floppy disks, or tape device), a computer system memory or random access memory (e.g., DRAM, DDR RAM, SRAM, EDO RAM, Rambus RAM, etc.), a non-volatile memory such as a Flash, magnetic media (e.g., a hard drive, or optical storage), registers, or other types of non-transitory memory. Non-transitory computer-readable medium 610 may include two or more memory mediums, which may reside in different locations (e.g., in different computer systems that are connected over a network).

Design information 615 may be specified using any of various appropriate computer languages, including hardware description languages such as, without limitation: VHDL, Verilog, SystemC, SystemVerilog, RHDL, M, MyHDL, etc. Design information 615 may be usable by semiconductor fabrication system 620 to fabricate at least a portion of integrated circuit 630. The format of design information 615 may be recognized by at least one semiconductor fabrication system 620. In some embodiments, design information 615 may also include one or more cell libraries, which specify the synthesis and/or layout of integrated circuit 630. In some embodiments, the design information is specified in whole or in part in the form of a netlist that specifies cell library elements and their connectivity.

Semiconductor fabrication system 620 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 620 may also be configured to perform various testing of fabricated circuits for correct operation.

In various embodiments, integrated circuit 630 is configured to operate according to a circuit design specified by design information 615, which may include performing any of the functionality described herein. For example, integrated circuit 630 may include any of various elements described with reference to FIGS. 1-5. Further, integrated circuit 630 may be configured to perform various functions described herein in conjunction with other components. The functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
    a capacitor;
    an inductor connected to the capacitor via a node, wherein the inductor is configured to store energy in the capacitor in response to a current at the inductor;
    an oscillator configured to:
        receive energy via the node; and
        intermittently supply energy;
    a bias circuit configured to:
        receive energy via the node; and
        output a difference between a voltage corresponding to the node and a reference voltage; and
    a switch configured, based on the output of the bias circuit, to provide energy to a voltage collection circuit by connecting the node to the voltage collection circuit.

2. The apparatus of claim 1, wherein the oscillator comprises one or more inductors and one or more capacitors, wherein the one or more inductors are configured to store energy in the one or more capacitors, and wherein the oscillator is configured to intermittently supply the energy using the one or more inductors and the one or more capacitors.

3. The apparatus of claim 2, wherein the one or more inductors of the oscillator are mutually coupled with the inductor.

4. The apparatus of claim 2, wherein the one or more inductors of the oscillator are smaller than the inductor.

5. The apparatus of claim 1, further comprising a bootstrap shutdown circuit configured to reduce the voltage corresponding to the node in response to the voltage corresponding to the node reaching at least a threshold level.

6. The apparatus of claim 5, wherein the bootstrap shutdown circuit is configured to reduce the voltage corresponding to the node by reducing the current at the inductor.

7. The apparatus of claim 1, wherein the switch is a metal-oxide-semiconductor field effect transistor (MOSFET).

8. The apparatus of claim 1, wherein the voltage collection circuit comprises:
    a battery;
    a main capacitor configured to provide energy to the battery; and
    a main inductor configured to store energy in the main capacitor in response to a current at the main inductor.

9. The apparatus of claim 8, wherein the main inductor is mutually coupled with the inductor.

10. The apparatus of claim 8, wherein the main inductor is larger than the inductor.

11. The apparatus of claim 8, wherein the main inductor, the inductor, and one or more inductors of the oscillator are integrated in a single substrate.

12. The apparatus of claim 8, wherein the main capacitor is larger than the capacitor.

13. The apparatus of claim 8, wherein the voltage collection circuit further comprises at least one switch configured, based on an output from the bias circuit, a main bias circuit of the voltage collection circuit, or both, to connect the main inductor to the main capacitor.

14. The apparatus of claim 8, wherein the voltage collection circuit further comprises at least one switch configured, based on an output from the bias circuit, to connect the main capacitor to the battery.

15. A non-transitory computer readable storage medium having stored thereon design information that specifies a circuit design in a format recognized by a fabrication system that is configured to use the design information to fabricate a hardware integrated circuit that includes a bootstrap circuit configured to operate according to the circuit design, wherein the bootstrap circuit includes:
    a capacitor;
    an inductor connected to the capacitor via a node, wherein the inductor is configured to store energy in the capacitor in response to a current at the inductor;
    an oscillator configured to:
        receive energy via the node; and
        intermittently supply energy;
    a bias circuit configured to:
        receive energy via the node; and
        output a difference between a voltage corresponding to the node and a reference voltage; and
    a switch configured, based on the output of the bias circuit, to provide energy to a voltage collection circuit by connecting the node to the voltage collection circuit.

16. The non-transitory computer readable storage medium of claim 15, wherein the circuit design specifies an apparatus, comprising:
    a substrate, comprising the inductor;
    a bearing extending in an axis perpendicular to the substrate; and
    a magnet connected to the bearing, wherein the magnet is parallel to the substrate and separate from the substrate, wherein the magnet extends over at least a portion of the inductor,
    wherein, in response to motion of the apparatus, the magnet is configured to rotate around the bearing and induce the current in the inductor.

17. The non-transitory computer readable storage medium of claim 16, wherein the circuit design further specifies that the substrate includes a plurality of bias magnets that are configured to cause the magnet to oscillate within a bounded range of motion based on a strength of the bias magnets, based on a strength of the magnet, and based on a force applied to the magnet due to the motion of the apparatus.

18. A method, comprising:
    receiving, at an inductor of a bootstrap circuit, a current;
    storing at least some energy corresponding to the current at a capacitor of the bootstrap circuit;
    providing at least a portion of the energy corresponding to the current to an oscillator of the bootstrap circuit, wherein the oscillator is configured, in response to receiving the at least a portion of the energy, to intermittently supply energy;
    providing a voltage from at least one of the inductor, the capacitor, or the oscillator to a bias circuit, wherein the bias circuit is configured, in response to the voltage coming within a threshold voltage difference of a reference voltage, to send a bias output to a switch; and providing, by the switch in response to the bias output, energy from at least one of the inductor, the capacitor, or the oscillator to a voltage collection circuit.

19. The method of claim 18, wherein providing the energy to the voltage collection circuit comprises providing the energy to a voltage input of a bias circuit of the voltage collection circuit.

20. The method of claim 18, further comprising, converting at least a portion of the energy supplied by the oscillator into a digital pulse, wherein the energy is provided to the voltage collection circuit in response to the digital pulse.

\* \* \* \* \*